United States Patent

[11] 3,558,897

[72] Inventor George A. May
2509 Tennis Cres., Vancouver, British Columbia, Canada
[21] Appl. No. 793,991
[22] Filed Jan. 27, 1969
[45] Patented Jan. 26, 1971

[54] P-N JUNCTION SCANNING DEVICE HAVING PHOTO-CONDUCTORS DISPOSED ON DEVICE WITH FIELD EFFECT LAYERS FOR CONTROLLING POSITION OF SCANNING SPOT
17 Claims, 8 Drawing Figs.

[52] U.S. Cl. .......... 250/209, 250/217, 313/108, 317/235
[51] Int. Cl. .......... H01l 15/06
[50] Field of Search .......... 250/209, 211, 217SSL; 317/235/27, 235/21, 235/211; 313/108D

[56] References Cited
UNITED STATES PATENTS
3,388,255 6/1968 May .......... 317/235
3,492,549 1/1970 Janning .......... 317/235

*Primary Examiner*—James W. Lawrence
*Assistant Examiner*—Martin Abramson
*Attorney*—Smart & Biggar

ABSTRACT: An elongated light-emitting multilayer semiconductor device having a modified metal insulator-semiconductor field effect transistor substructure producing a spot of light controllably variable in intensity and position, and scanning devices including one or more of such devices in combination with light-responsive elements.

INVENTOR
GEORGE A. MAY
BY Smart & Biggar
ATTORNEYS

PATENTED JAN 26 1971

3,558,897

INVENTOR
GEORGE A. MAY
BY [signature]
ATTORNEYS

P-N JUNCTION SCANNING DEVICE HAVING PHOTOCONDUCTORS DISPOSED ON DEVICE WITH FIELD EFFECT LAYERS FOR CONTROLLING POSITION OF SCANNING SPOT

BACKGROUND AND GENERAL DESCRIPTION

This invention relates to long, narrow, light-emitting semiconductor junction devices and to derivative devices incorporating such junction devices.

It is known that certain types of semiconductor junctions are light-emtting. Applicant's U.S. Pat. No. 3,388,255, issued Jun. 11, 1968 disclosed a long, narrow light-emitting semiconductor junction comprising a lowermost (say) conducting layer, a semiconductor layer in ohmic contact with the conducting layer, and a second (uppermost) semiconductor layer of opposite conductivity or doping to the first semiconductor layer and forming a P-N junction with it. The uppermost semiconductor layer is provided with a pair of terminals, one at either end. When suitable voltages are applied to each of these terminals and to the conducting layer, the junction will emit light along that portion of the device in which the voltage on the uppermost layer exceeds the voltage on the conducting layer by the barrier voltage of the junction. When this condition is satisfied, the junction emits light in the vicinity of the end of the uppermost semiconductor layer nearest the terminal at highest potential. As the potential at this terminal of the uppermost layer is increased, more and more of the junction emits light until eventually the device is light-emitting over its entire length. The length of the light-emitting portion thus can be controlled.

Also known are metal insulator-semiconductor field effect transistors. Such transistors operate by the control of the flow of electrons through a semiconductor layer. The device includes a layer of semiconductor material and a gate electrode insulated from the semiconductor layer by a gate insulator. Ohmic contacts are applied to opposite ends of the semiconductor layer and terminals are applied to these contacts. There is also a terminal applied to the gate electrode. With potential applied between the terminals on the semiconductor layer, and the gate electrode open circuited, the device is simply a resistive circuit (for small currents). Applying a potential of proper polarity to the gate electrode, a capacitor is formed by the gate electrode and the semiconductor layer. The effect of this is to narrow the "channel" through which the electrons can flow through the semiconductor layer and it is possible, therefore, to control the current flow through the device. If the potential on the grid electrode is large enough, the channel can be "pinched off" and no current flows through the device.

In conventional metal insulator field effect transistors the gate electrode is made from a good conducting material. According to the present invention, the gate electrode is made from a resistive material; terminals are attached at either end of the gate electrode. Thus, it is possible to establish a voltage gradient along the gate electrode. The potential between the gate electrode and the semiconductor layer varies along the length of the layer. It is possible, therefore, by suitably selecting the voltages applied to the various terminals, to have a portion of the semiconductor layer conducting current while the remainder of the layer is "pinched off."

In its broadest aspects, the present invention provides a long, narrow light-emitting semiconductor junction of the type described in U.S. Pat. No. 3,388,255, to which is applied an insulating film in contact with the semiconductor sandwich layer, and a resistive gate film separated from the sandwich layer by the insulating film and capable, when a voltage gradient is created along the length of the gate film, of pinching off current in the sandwich layer thereby to restrict the emission of light from the junction to a spot. Such a device could perform the same functions as a one-line-scan cathode ray oscilloscope, e.g. facsimile scanning and recording.

By spacing photoconductors along the aforesaid junction device, and attaching output wires to the photoconductors, a scanning device according to the invention may be produced. This is an improvement over the scanning device disclosed in applicant's aforesaid U.S. Pat. No. 3,388,255 which required the use of a pair of junctions and associated photoconductors.

Furthermore, the output wires of the photoconductors on the junction device of the present invention may be extended as grid wires, combined with grid wires in one or more planes perpendicular to the first plane of the grid wires, and connected to another junction device according to the invention, so that a two or three-dimensional scanning device is created. If some electroresponsive material is sandwiched between the grid wires, many types of derivative devices are possible. For example, if an electroluminescent sandwich layer is used, a video display similar to a conventional cathode ray oscilloscope may be constructed. A further embodiment of the invention provides a light-emitting junction which can lase.

The term "photoconductor" as applied herein, includes various forms of light-sensitive switching elements which display a marked increase in electric conductivity when illuminated, and will be understood to encompass photodiodes, phototransistors and photosilicon controlled rectifiers, as well as other devices with similar properties.

DETAILED DESCRIPTION WITH REFERENCE TO THE DRAWINGS

Figures 1, 2, 3, 3A, 5:
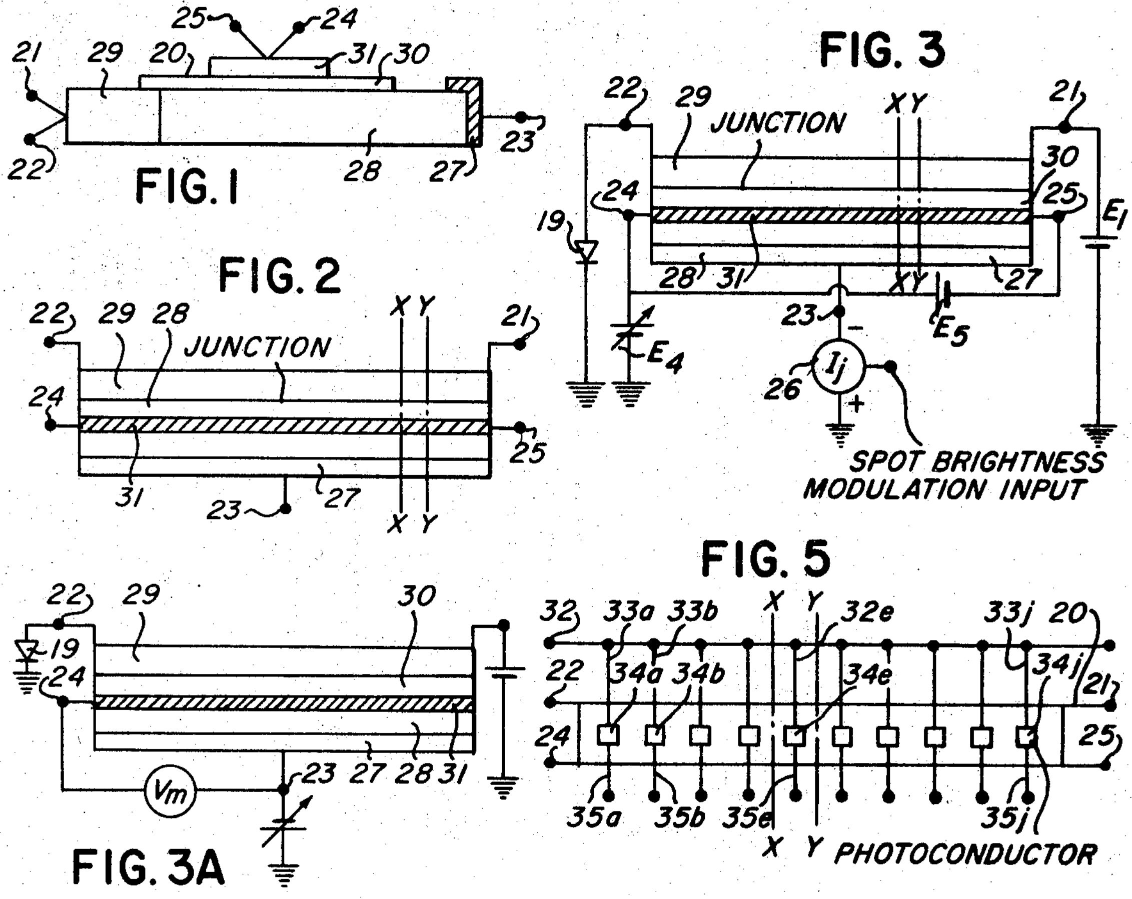
FIG. 1 is a schematic cross-sectional end view of the light-emitting junction device according to the invention.
FIG. 2 is a schematic plan view of the junction device of FIG. 1.
FIG. 3 is a schematic illustration of an operating circuit using the junction device of FIG. 2.
FIG. 3A is a schematic illustration of an alternative operating circuit using the device of FIG. 2.
FIG. 5 is a simplified illustration of a scanning device incorporating a junction device according to the invention.

A schematic cross-sectional view of a light-emitting junction according to the invention is illustrated in FIG. 1, and a schematic plan view in FIG. 2. The device indicated generally by the numeral 20 includes a conducting layer 27 preferably of metal, a semiconductor sandwich layer 28 fixed to the conducting layer 27 and which may, for example, be N-doped, and an outer semiconductor layer 29 which may, for example, be P-doped. Terminals 21 and 22 are attached one at either end of layer 29, and terminal 23 is attached to layer 27. Abutting the semiconductor layer 28 and 29 is an insulating layer 30 to which is fixed a gate electrode 31 in the form of a film of resistive material. Terminals 24 and 25 are attached one at either end of the gate film 31. The device 20 may be fixed to a suitable insulating substrate (not shown). The dimensions shown in FIG. 1 are of course not exemplary of an actual device but are drawn in the simplified manner shown in the interests of clarity of description. The positions of films 30 and 31 with respect to the positions of layers 28 and 29 can be approximately as shown in FIG. 1. The layer 31 must be directly over the layer 28 and should be as narrow as possible. Layer 31 should also be close to but not over the junction between layers 28 and 29. Layer 30, being an insulating layer, is not so critical, but must completely shield the layer 31.

As disclosed in applicant's aforesaid U.S. Pat. No. 3,388,255, by applying suitable voltages to terminals 21, 22 and 23 the light-emitting junction can be forward biased right of the line XX (say). Voltages applied to terminals 24 and 25 then establish a voltage gradient along the gate film 31. A scanning voltage applied to terminal 24 can "pinch off" the "channel" right of the line YY, in a manner similar to that of metal insulated field effect transistor. In other works, the field effect blocks current flow through the light-emitting junction right of the line YY. Thus the only portion of the light-emitting junction which can emit light is the "spot" portion between the line XX and YY.

Generally, it is desired that the light spot be small and sharply defined. A practical operating circuit which keeps the spot zone XX–YY narrow is shown in FIG. 3. This circuit also permits the modulation of the brightness of this spot zone. The diode 19 provides a bias voltage for the device at terminal 22. Any other appropriate source of bias voltage may be used instead. For any setting of the scanning voltage $E_4$, the current source 26 connected to the terminal 23 automatically adjusts the voltage at terminal 23, as discussed below, until a total current $I_j$ flows across the junction in the spot zone XX–YY. Since this current $I_j$ can be externally determined, the brightness of the spot can be modulated.

Since brightness is proportional to the total current through the junction at the light-emitting point, then having fixed the voltage gradient on layers 29 and 31, the actual voltages on these layers with respect to layer 27 then determines the current density at each point of the light-emitting zone. Since the current density integrated over the light-emitting zone must be equal to the specified total current, the zone is automatically kept narrow.

Figure 4:
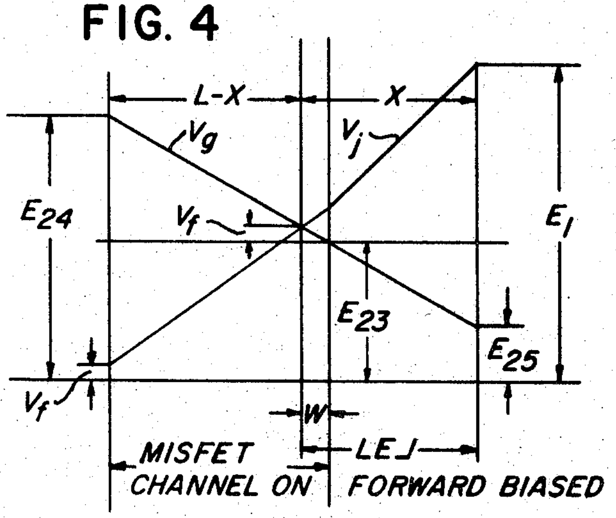
FIG. 4 is a graph showing the voltage profiles of the junction device of the invention using the operating circuit of FIG. 3.

The operation of the circuit of FIG. 3 can best be described with reference to FIG. 4 which is a graph showing the voltage profiles of the circuit of FIG. 3. In FIG. 4, $V_g$ is a plot of the voltage along the gate film 31, and $V_j$ is a plot of the voltage along the layer 29. The current source 26 shown in FIG. 3 can be, for example, a bipolar transistor in the grounded base or grounded emitter configuration. Such a source provides very nearly the same current whatever the voltage applied across the source. Referring to FIG. 4, the voltage along the layer 29 is determined by a voltage $V_f$, the forward voltage of the light-emitting junction, which may be imagined as a voltage applied to terminal 22, and the voltage $E_1$ applied to terminal 21. The voltage along the gate film 31 is fixed with respect to ground by voltages applied to terminals 24 and 25. If the voltage at terminal 23 were less, a longer region of the junction would conduct, causing more current to flow. Since this current flows through the current source 26, however, a small increase in current will cause a large increase in the voltage at terminal 23, thus causing the current and hence the length of the light-emitting portion to decrease. Thus the voltage at terminal 23 automatically adjusts itself until a total current $I_j$ flows.

As a working example of a junction device of the type described above, consider a device having a length of 4 cm., a spot brightness current modulation input $I_j$ of 5 ma., a P-layer resistance of 100 ohms/cm. (without minority carrier conductivity modulation), a field effect channel length of 5 u, a gate insulator thickness of 1,000 A, a gate insulator permitivity of 10 times that of free space, an electron mobility of 6,000 cm.$^2$/volt-sec. and a gate insulator film breakdown voltage of greater than 40 volts. Further assume that the maximum difference between the voltage $E_1$ applied to terminal 21 and the forward voltage through the junction is 40 volts. Then the light spot width, if defined to be the distance between points of zero intensity, at the start of the scan is about 0.8×10—2 cm., and is about the same at the end of the scan. If the width of the spot is defined instead to be between points of half intensity the light spot width is about half the aforesaid FIG., giving a maximum resolution of about 250 lines per centimeter.

The theoretical calculation of the zero intensity-to-zero intensity light spot width is obtained from the following equation:

$$W=\left[\frac{6td}{\epsilon\mu}\cdot I_J\cdot\frac{(\nabla V(x,o)-\nabla V_G)}{|\nabla V_G|^3\cdot\nabla V(x,o)}\right]^{1/3}$$

where

W is the light spot width;

t is the thickness of the insulation layer 30;

d is the length of the field effect transistor channel;

$\epsilon$ is the permitivity of the insulator layer 30;

$\mu$ is the electron mobility;

$I_j$ is the total current flowing across the light-emitting junction;

$\nabla V(x, o)$ is the gradient of the voltage on the P-layer of the light-emitting junction at $y=0$ when a portion $x$ of the light-emitting junction is forward biased, and $\nabla V_G$ is the voltage gradient on the gate film 31 along the length of the junction.

The theoretical dependence of the spot location $x$ on the applicable device parameters is $$x=\frac{(Po\,I_J+\nabla V_G+(E_1-V_f)/L)}{2Po\,I_J}-\frac{\sqrt{[Po\,I_J+\nabla V_G+(E_1-V_f)/L]^2-4Po\,I_J(E_1-E_4)}}{2Po\,I_J}$$

where $x$ is the distance from the right-hand end of the device of the spot;

$Po$ is the resistance per unit length of the P layer;

$I_j$ is the total current current flowing across the junction;

$V_g$ is the voltage gradient on the gate film 31 along the length of the junction;

$E_1$ is the voltage applied to terminal 21;

$E_4$ is the voltage at terminal 24;

$V_f$ is the forward voltage of the junction; and

L is the length of the junction.

Where $Po\,I_j$ is relatively small, the spot position $x$ is approximately linearly dependent upon the voltage $E_4$. Because the spot position also changes when $I_j$ is changed, (there is a change of the order of 1.6 lines for a current change of 5 ma. in a the above example), it is desirable to apply a correction voltage to the scanning voltage derived from the current source 26, where the application requires the modulation of the current $I_j$.

Scanning can thus be explained in this way:

The gradient of voltage $V_g$ is kept constant by the voltage source $E_5$, and the actual voltage $V_G$ determined by the voltage source $E_4$ (FIG. 3). Having fixed the current $I_j$ by the current source 26, the voltage of layer 27 automatically adjusts itself to focus the spot. Thus the result of changing the voltage of source $E_4$ is to move the position of the light spot to another location.

Another way to keep the spot zone narrow is to omit the current source 26 and to substitute for the resistive gate film 31 a photovoltaic film, such as a bulk effect film of the cadmium sulfide type, or a composite film built up of photovoltaic films in series, formed by evaporation. The sole requirement is that an electric field be developed in the film when it is illuminated by light from the junction. The light from the spot zone then generates sufficient voltage to pinch off current flow on that side of the spot that would otherwise emit light, thereby automatically keeping the spot zone narrow. The brightness of the spot can be regulated by a modulation voltage applied between the terminal 23 biased negatively and the terminal 24, as shown in FIG. 3A. This approach to spot zone narrowing avoids the sharp voltage gradient (which tend to cause excessive gate voltage at the extremities of the gate film) which is required if the simple resistive gate film is used. However, the response of the circuit of FIG. 3A is likely to be slower and the device more complex, partly because of the importance of shielding the device from ambient light.

A scanning device incorporating the junction device 20 according to the invention is shown in FIG. 5. In this FIG., the junction device 20 is shown in a simplified manner is being of unitary construction, although it will be understood that the device 20 includes all the layers referred to previously with references to FIGS. 1—3. Attached to the outer semiconductor layer of the device 20 (i.e. the layer 29 of FIGS. 1—3) are a plurality of regularly spaced photoconductors 34*a*, 34*b*, etc. Each photoconductor is shielded from all light except light emitted from the junction to which it is attached in the immediate vicinity of the photoconductor. A series of input lead wires 33*a*, 33*b*, etc. are also attached to each of the photoconductors 34*a*, 34*b*, etc., and a series of output wires 35*a*, 35*b* are also attached to the corresponding photoconductors. If a single input is desired to be introduced through all the input lead wires, the lead wires all may be attached to an input terminal 32 as shown in FIG. 5.

As an example of the operation of the device of FIG. 5, the size of the spot zone is selected to illuminate only one photoconductor (say) at a time. Thus the light-emitting zone excites only the photoconductor 34*e*,and the only conducting circuit is between the input terminal 32, through photoconductor 34*e* and to output lead 35*e*. Thus the scanner operates as an optoelectronic switch. Only 10 photoconductors are shown in FIG. 9, but it will be appreciated that, in actual practice, perhaps hundreds of photoconductors would occupy the same few inches.

Figure 6:
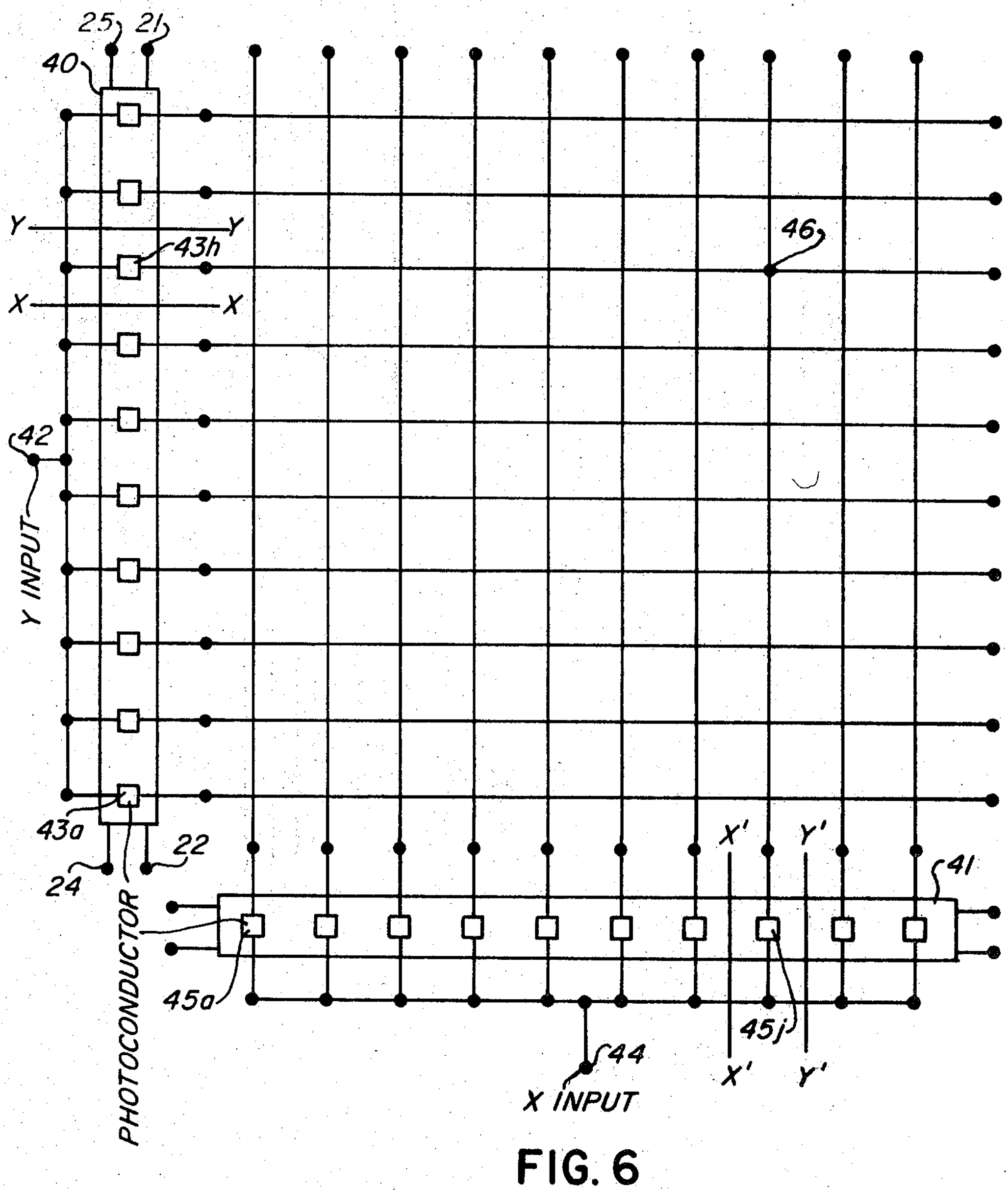
FIG. 6 illustrates a simplified two-dimensional scanning arrangement incorporating two junction devices according to the invention.

If the one-dimensional scanning device of FIG. 5 is combined with another such scanning device at right angles to fit and the output terminals of the photoconductors of each device are provided with extending grid wires, a two dimensional configuration of grid wires such as that shown in FIG. 6 may be arranged. In this FIG., each of the light-emitting semiconductor devices 40 and 41 correspond to the device 20 shown in FIG. 5. In FIG. 6, as an exemplary operating point, the device 40 is shown as having the spot zone of light XX–YY exciting photoconductor 43L and, therefore, the only completed circuit through the device is from the common input 42 through the photoconductor 43*h*. Likewise, the only completed circuit through the device 41 is from the common input 44 through the photoconductor 45*j*. Thus the point 46 is the only point on the entire grid display in which a conducting grid wire connected to the Y-input 42 overlaps a conducting grid wire connected to the X-input 44.

Figure 7:
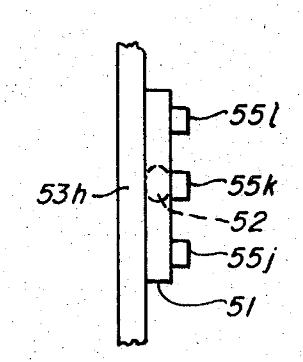
FIG. 7 is a schematic expanded section detail view, of a portion of the grid wire array in the scanning device of FIG. 6.

If the grid wires associated with the device 40 are spaced apart from the grid wires of the device 41 by a layer of electroresponsive material many useful devices are possible. For example, if a suitable DC excitable electroluminescent layer is sandwiched between the grid wires, and video voltage applied between terminals 42 and 44, the configuration shown in FIG. 6 may be used to give dynamic lighted displays in the same way as a cathode ray tube. FIG. 7 illustrates the foregoing suggestion, in which an electroluminescent layer 51 is shown positioned between two sets of grid wires. A grid wire 53*h* is shown as extending vertically alongside the electroluminescent layer 51 while a series of grid wires 55*j*, 55*k* and 55*l* are shown as extending horizontally along the layer 51. Thus, if the grid wire 53*h* and the grid wire 55*k* are the only ones conducting current, the only region of the electroluminescent layer 51 which will be subjected to appreciable excitation will be the region of intersection 52 of the two grid wires 53*h* and 55*k* shown enclosed approximately by broken lines in FIG. 7. In all other regions of the electroluminescent layer, insufficient or substantially no current flow will be present to cause light emission from the electroluminescent layer. The excited region of the electroluminescent layer may be changed by changing the position of the spots of light on the light-emitting junctions. Thus the point of light emitted by the electroluminescent layer may be made to move in response to current variation in the junction. The intensity of light is determined by the amplitude of the applied video voltage.

The spot scanner could also obviously be used as an analogue indicator. Other useful devices can be made depending upon the choice of electroresponsive material used between the grid wires. Applicant's U.S. Pat. No. 3,388,255 disclosed several such devices which can be readily modified by persons skilled in the art to utilize the junction device of the present invention.

The device according to the invention can be fabricated using known methods of manufacture, such as diffusion and etching. The semiconductor layers must, of course, be chosen so that the junction will be light-emitting. The most common of these junctions are gallium arsenide and the gallium arsenide—gallium phosphide semiconductor junctions.

Further according to the present invention, the semiconductor layers may be chosen such that the light-emitting junction can lase. (Any light-emitting junction which is sufficiently efficient can lase). In particular, "direct-gap materials" like GaAs, $GaAs_xP_{1-x}$ ($1-x$0.4), $Ga_xAl_{1-x}As$($1-x<0.4$) can be fabricated into lasing diodes. By "direct gap materials" it is meant materials where the electron transition from the "conduction" band to the "valency" band involves the emission of a photon only. A laser diode must also have plane surfaces normal to the light-emitting junction to form an optical resonance cavity. The laser embodiment is used where coherent radiation is required.

While specific embodiments of the invention have been described above, the invention is not limited thereto but extends to analogous apparatus within the scope of the appended claims.

I claim:

1. A light-emitting semiconductor junction device comprising: a conducting layer; an outer semiconductor layer; a sandwich semiconductor layer sandwiched between the conducting layer and the outer semiconductor layer and of opposite conductivity to the outer semiconductor layer and forming a junction with the outer semiconductor layer; said layers being selected so that current flow through the junction causes emission of light; an insulating layer in contact with the sandwich semiconductor layer; a resistive layer in contact with the insulating layer and separated from the sandwich semiconductor layer by the insulating layer and creating a field effect in the sandwich semiconductor layer in response to a voltage applied across the ends of the resistive layer thereby to restrict the area of emission of light from the junction device to a spot of light.

2. A scanning device comprising a junction device according to claim 1, a plurality of regularly spaced photoconductors mounted on said device, a plurality of lead wires each connected to a discrete one of the said photoconductors, and a plurality of output wires each emanating from a discrete one of said photoconductors.

3. A two-dimensional scanning apparatus comprising a pair of scanning devices each constructed according to claim 2, wherein the output wires of one of said devices are extended to form a first series of parallel grid wires, and the output wires of the other of said devices are extended to form a second series of parallel grid wires at an angle to said first series of parallel grid wires.

4. A two-dimensional scanning apparatus as defined in claim 3, wherein said angle is of the order of 90°.

5. Apparatus as defined in claim 3, additionally including a plane electroluminescent layer interposed between and in contact with the first series of grid wires and the second series of grid wires.

6. Apparatus as defined in claim 4, additionally including a plane electroluminescent layer interposed between and in contact with the first series of grid wire and the second series of grid wires.

7. A device as defined in claim 1, wherein the said first and second semiconductor layers are chosen such that the junction formed by the two said layers can lase.

8. A junction device as defined in claim 1, having a terminal at each end of the resistive layer and at each end of the outer semiconductor layer.

9. A junction device as defined in claim 8, additionally comprising a first voltage source having its positive terminal connected to one terminal of the outer semiconductor layer; a second voltage source having it negative terminal connected to that terminal of the resistive layer at the same end of the junction device as the said one terminal of the outer semiconductor layer; a variable voltage source having its positive terminal connected to the other terminal of the resistive layer and to the positive terminal of the second voltage source; a variable current source having its negative terminal connected to the conducting layer; a bias voltage producing means having its positive terminal connected to the other terminal of the outer semiconductor layer and its negative terminal connected to the negative terminal of the variable voltage source, the negative terminal of the first voltage source, and the positive terminal of the current source; whereby the position of the light spot is determined by the voltage applied by the variable voltage source and the brightness of the spot is determined by the current generated by the current source.

10. A scanning device comprising a current indicating device according to claim 9, a plurality of regularly spaced photoconductors mounted on said device, a plurality of lead wires each connected to a discrete one of the said photoconductors, and a plurality of output wires each emanating from a discrete one of said photoconductors.

11. A two-dimensional scanning apparatus comprising a pair of scanning devices each constructed according to claim 10, wherein the output of one of said devices are extended to form a first series of parallel grid wires, and the output wires of the other of said devices are extended to form a second series of parallel grid wires at right angles to said first series of parallel grid wires.

12. A two-dimensional scanning apparatus as defined in claim 11, wherein said angle is of the order of 90°.

13. Apparatus as defined in claim 11, additionally including a plane electroluminescent layer interposed between and in contact with the first series of grid wires and the second series of grid wires.

14. Apparatus as defined in claim 12, additionally including a plane electroluminescent layer interposed between and in contact with the first series of grid wires and the second series of grid wires.

15. A device as defined in claim 9, wherein the said first and second semiconductor layers are chosen such that the junction formed by the two said layers can lase.

16. A light-emitting semiconductor junction device comprising: a conducting layer; an outer semiconductor layer; a sandwich semiconductor layer sandwiched between the conducting layer and the outer semiconductor layer and of opposite conductivity to the outer semiconductor layer and forming a junction with the outer semiconductor layer; said layers being selected so that current flow through the junction causes emission of light; an insulating layer in contact with the sandwich semiconductor layer; a photovoltaic layer in contact with the insulating layer and separated from the sandwich semiconductor layer by the insulating layer and creating a field effect in the sandwich semiconductor layer in response to a voltage applied across the ends of the photovoltaic layer thereby to restrict the area of emission of light from the junction device to a spot of light.

17. A junction device as defined in claim 8, additionally comprising a first voltage source having its positive terminal connected to one terminal of the outer semiconductor layer; a second voltage source having its negative terminal connected to that terminal of the resistive layer at the same end of the junction device as the said one terminal of the outer semiconductor layer; a variable voltage source having its positive terminal connected to the other terminal of the resistive layer and to the positive terminal of the second voltage source; a variable current source having its negative terminal connected to the conducting layer; a diode having its positive terminal connected to the other terminal of the outer semiconductor layer and its negative terminal connected to the negative terminal of the variable voltage source, the negative terminal of the first voltage source, and the positive terminal of the current source; whereby the position of the light spot is determined by the voltage applied by the variable voltage source and the brightness of the spot is determined by the current generated by the current source.